United States Patent
Kong et al.

(10) Patent No.: US 7,891,280 B2
(45) Date of Patent: Feb. 22, 2011

(54) METHOD FOR CUTTING PCB

(75) Inventors: Xiang-Qing Kong, Shenzhen (CN); Jian-Feng Wang, Shenzhen (CN); Tong Zhou, Shenzhen (CN)

(73) Assignees: Innocom Technology (Shenzhen) Co., Ltd., Shenzhen, Guangdong Province (CN); Chimel Innolux Corpration, Miao-Li County (TW)

( * ) Notice: Subject to any disclaimer, the term of this patent is extended or adjusted under 35 U.S.C. 154(b) by 378 days.

(21) Appl. No.: 12/080,308

(22) Filed: Apr. 2, 2008

(65) Prior Publication Data

US 2008/0236348 A1    Oct. 2, 2008

(30) Foreign Application Priority Data

Apr. 2, 2007    (TW)    ............... 96111574 A

(51) Int. Cl.
  *B26D 3/00*     (2006.01)
  *H05K 3/00*     (2006.01)
(52) U.S. Cl. ............... 83/929.1; 83/13; 29/835; 700/121
(58) Field of Classification Search ............... 700/95, 700/121, 171, 173, 180, 182, 184; 703/1, 703/6; 29/825, 835; 83/13, 929.1; 716/2
See application file for complete search history.

(56) References Cited

U.S. PATENT DOCUMENTS

| 4,532,839 A | * | 8/1985 | Easton | ............... | 83/29 |
| 4,830,554 A | * | 5/1989 | Lopez | ............... | 83/929.1 |
| 6,671,940 B2 | * | 1/2004 | Ishii | ............... | 83/929.1 |
| 6,754,949 B2 | * | 6/2004 | Ishii | ............... | 83/929.1 |
| 7,392,583 B2 | * | 7/2008 | Williams et al. | ............... | 29/835 |
| 2002/0054800 A1 | * | 5/2002 | Hwu et al. | ............... | 409/116 |

FOREIGN PATENT DOCUMENTS

| CN | 1560779 A | 1/2005 |
| TW | 573261 B | 1/2004 |

OTHER PUBLICATIONS

Author: Cai Yang Title of the thesis of postgraduate: The Research of the Optimized Layout of Parts Published by Qingdao University of Science and Technology on Jun. 30, 2005. p. 2, section 1.1.1, and pp. 22-24 and 27-31 may be relevant.

* cited by examiner

*Primary Examiner*—Charles R Kasenge
(74) *Attorney, Agent, or Firm*—Wei Te Chung

(57) ABSTRACT

An exemplary method for cutting a first printed circuit board (PCB) into a plurality of second PCBs, the method includes: providing a plurality of first dimension parameters of the first PCB; providing a plurality of second dimension parameters and an interval parameter of the second PCB; performing a process for selecting a best calculating mode and a corresponding cutting parameter according to the first dimension parameters, the second dimension parameters, and the interval parameter; calculating coordinate parameters of each second PCB; and cutting the first PCB into the plurality of second PCBs.

20 Claims, 3 Drawing Sheets

METHOD FOR CUTTING PCB

FIELD OF THE INVENTION

The present invention relates to a method for cutting a printed circuit board (PCB).

GENERAL BACKGROUND

PCBs have been widely used in various electronic products such as personal computers, notebooks, personal digital assistants (PDAs), video cameras, and the like. Normally, different electronic products include mass-produced PCBs having different dimensions.

In a normal process of manufacturing PCBs, a mother board which has a first dimension is divided into a plurality of production PCBs which have a second dimension. In the process of cutting the mother board, a calculating operation is performed to compute a number of cutting parameters for improving a utilization ratio of the mother board. However, when the calculating process is performed by a human operator, much time is needed, and the result is liable to be inaccurate.

It is desired to provide a method for cutting a PCB which overcomes the above-described deficiencies.

SUMMARY

In one preferred embodiment, a method for cutting a first printed circuit board (PCB) to a plurality of finished PCBs is provided. The method includes: providing a plurality of first dimension parameters of the first PCB; providing a plurality of second dimension parameters and an interval parameter of the second PCB; performing a process for selecting a best calculating mode and a corresponding cutting parameter according to the first dimension parameters, the second dimension parameters, and the interval parameter; calculating coordinate parameters of each second PCB; and cutting the first PCB into the plurality of second PCBs.

Other novel features and advantages of the above-described method will become more apparent from the following detailed description when taken in conjunction with the accompanying drawings.

DETAILED DESCRIPTION OF PREFERRED EMBODIMENTS

Reference will now be made to the drawings to describe various embodiments of the present invention in detail.

Figure 1:
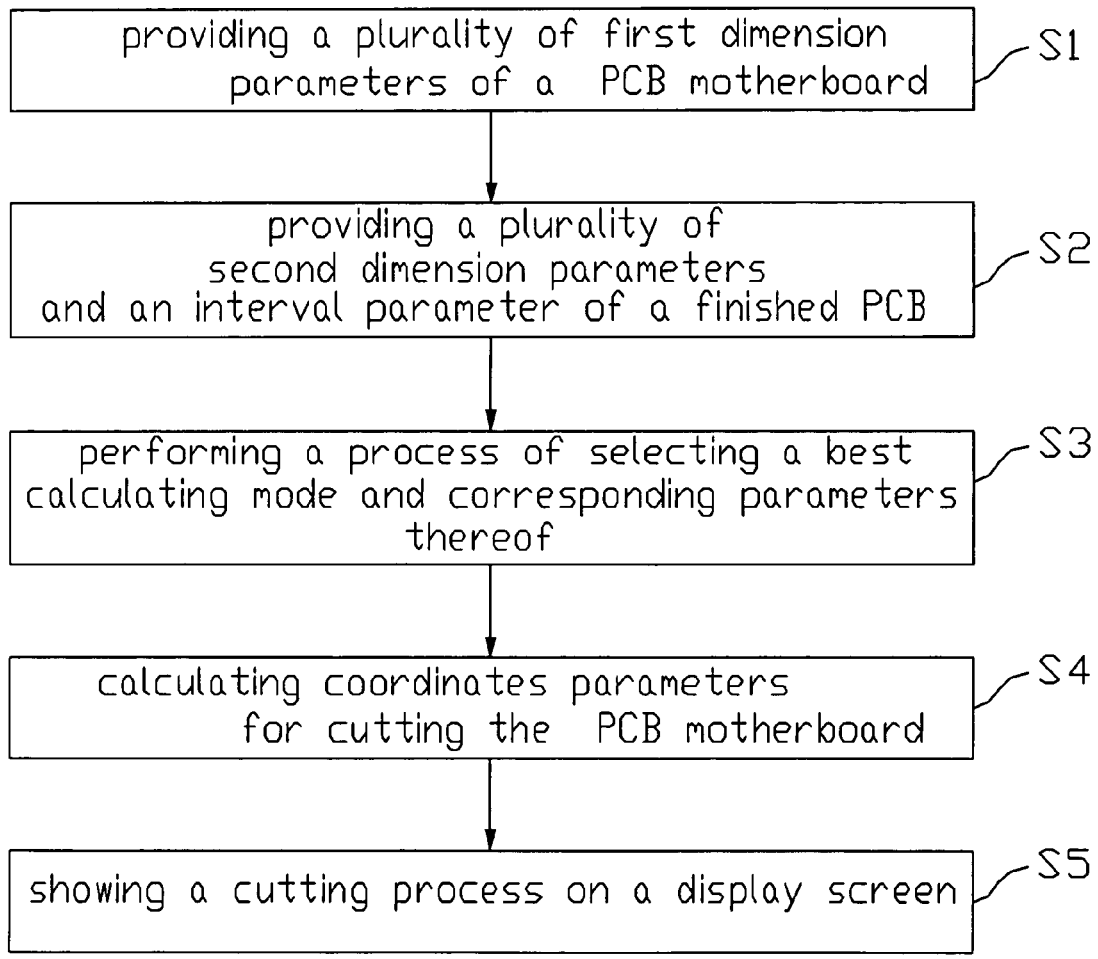
FIG. 1 is a flowchart summarizing a method for cutting a PCB motherboard into a plurality of finished PCBs according to an exemplary embodiment of the present invention.

Referring to FIG. 1, a method for cutting a PCB motherboard into a plurality of finished PCBs according to an exemplary embodiment of the present invention is shown. The method includes: step S1, providing a plurality of first dimension parameters of a PCB motherboard; step S2, providing a plurality of second dimension parameters and an interval parameter of a finished PCB; step S3, performing a process of selecting a best calculating mode and corresponding parameters thereof according to the above mentioned parameters; step S4, calculating coordinate parameters for cutting the PCB motherboard; and step 5, showing a cutting process on a display screen.

In step S1, a plurality of first dimension parameters of a PCB motherboard is obtained. This includes providing a rectangular (or square) PCB motherboard, and measuring the PCB motherboard to obtain the first dimension parameters such as a first length and a first width. The first dimension parameters of the PCB motherboard can also be provided by a PCB supplier. In this embodiment, it is assumed that the first length of the PCB motherboard is equal to "A", and the first width of the PCB motherboard is equal to "B" ($B \leq A$).

In step S2, second dimension parameters and an interval parameter of a finished PCB is attained. This includes providing a rectangular (or square) finished PCB; measuring the finished PCB to obtain a plurality of second dimension parameters of the finished PCB such as a second length and a second width; and providing an interval parameter representing an interval between each two adjacent finished PCBs. The second dimension parameters and the interval parameter can also be provided by a customer who buys the finished PCBs. In this embodiment, it is assumed that the second length of the finished PCB is equal to "a" and the second width of the finished PCB is equal to "b", wherein the interval parameter is incorporated into the second length and the second width ($b \leq a$).

In step S3, a process is performed to select a best calculating mode. In the process, the above parameters "A", "B", "a" and "b" are inputted to a computer by an operator through, e.g., a keyboard of the computer. According to an arrangement of the finished PCBs, four calculating modes for cutting the PCB motherboard into the finished PCBs are defined in this embodiment.

Figure 2:
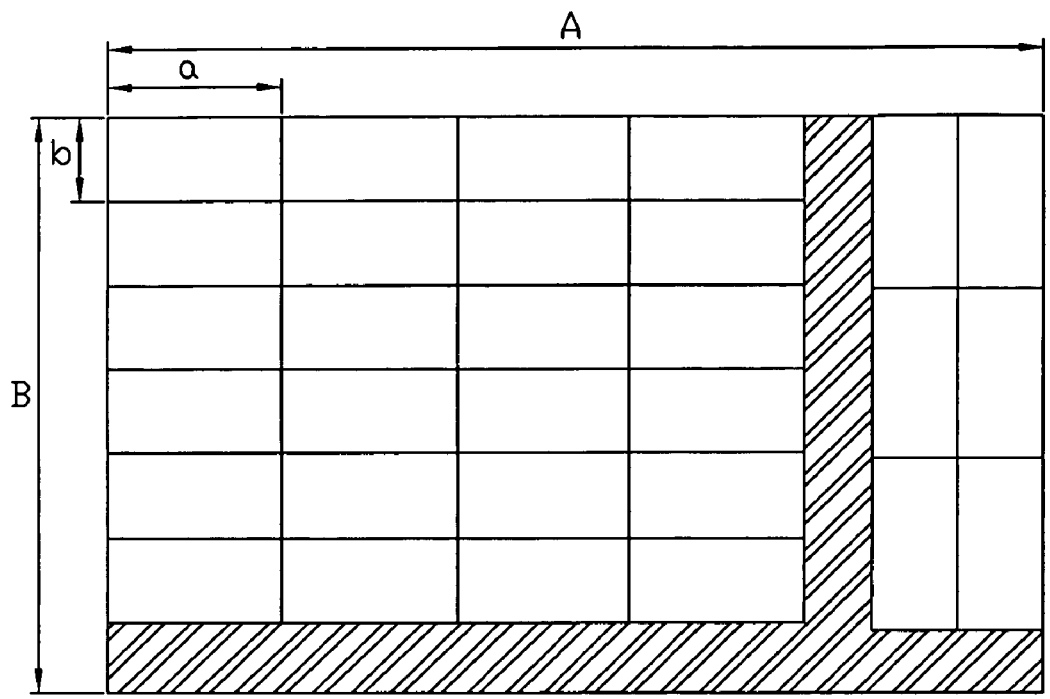
FIG. 2 is a plan view of a first arrangement of the finished PCBs according to a first calculating mode in the method of FIG. 1.

Referring to FIG. 2, a first arrangement of the finished PCBs according to a first calculating mode is shown. In the first calculating mode, the finished PCBs are mainly horizontally oriented, and are arranged in rows. For example, the PCB motherboard is defined to include a left part and a right part. The left part of the PCB motherboard is divided into a number j ($j=[B/b]$, wherein j is a natural number) of first rows. Each first row includes a number i ($1 \leq i=[A/a]$, wherein i is a natural number) of horizontally oriented finished PCBs. The right part is divided into a number $[B/a]$ of second rows. Each second row includes a number $[(A-a \times i)/b]$ of vertically oriented finished PCBs. An area sum of the finished PCBs divided by the PCB motherboard according to the first calculating mode is calculated with the following formula (1):

$$C_1[i] = i \times \left(\frac{B}{b}\right) + \left(\frac{A - a \times i}{b}\right) \times \left(\frac{B}{a}\right) \tag{1}$$

The computer calculates a plurality of area sums according to the formula (1) while the parameter "i" is respectively equal to 1, 2, 3 ... $[A/a]$. Then the computer compares the area sums to obtain a first maximum area sum $C_{1max}[i]$ of the finished PCBs and a corresponding cutting parameter $i_{max\ 1}$.

In order to conveniently describe the position of each finished PCB, a Cartesian-type coordinate system (i.e. an X-axis, a Y-axis, and an origin in the top left corner) is defined on the PCB motherboard. The Cartesian-type coordinate system is virtual only.

In the left part of the PCB motherboard, the position of a random finished PCB (e.g. in a number i column and in a number j row, counting from left to right and top to bottom can be confirmed by a first position $(X_1, Y_1)$ at a top left corner of the random finished PCB and a second position $(X_2, Y_2)$ at a bottom right corner of the random finished PCB. The first position $(X_1, Y_1)$ and the second position $(X_2, Y_2)$ are calculated according to the following coordinate calculating formulas: $X_1 = a \times (i-1)$, $Y_1 = b \times (j-1)$, $X_2 = a \times i$, $Y_2 = b \times j$.

In the right part of the PCB motherboard, the position of a random finished PCB (e.g. in a number m column and in a number n row, counting from right to left and top to bottom can be confirmed by a third position $(X_3, Y_3)$ at a top left corner of the random finished PCB and a fourth position $(X_4, Y_4)$ at a bottom right corner of the random finished PCB. The first position $(X_3, Y_3)$ and the second position $(X_4, Y_4)$ are calculated according to the following coordinate calculating formulas: $X_3 = A - b \times m$, $Y_3 = a \times n - a$, $X_4 = A - b \times m + b$, $Y_4 = a \times n$.

Figure 3:
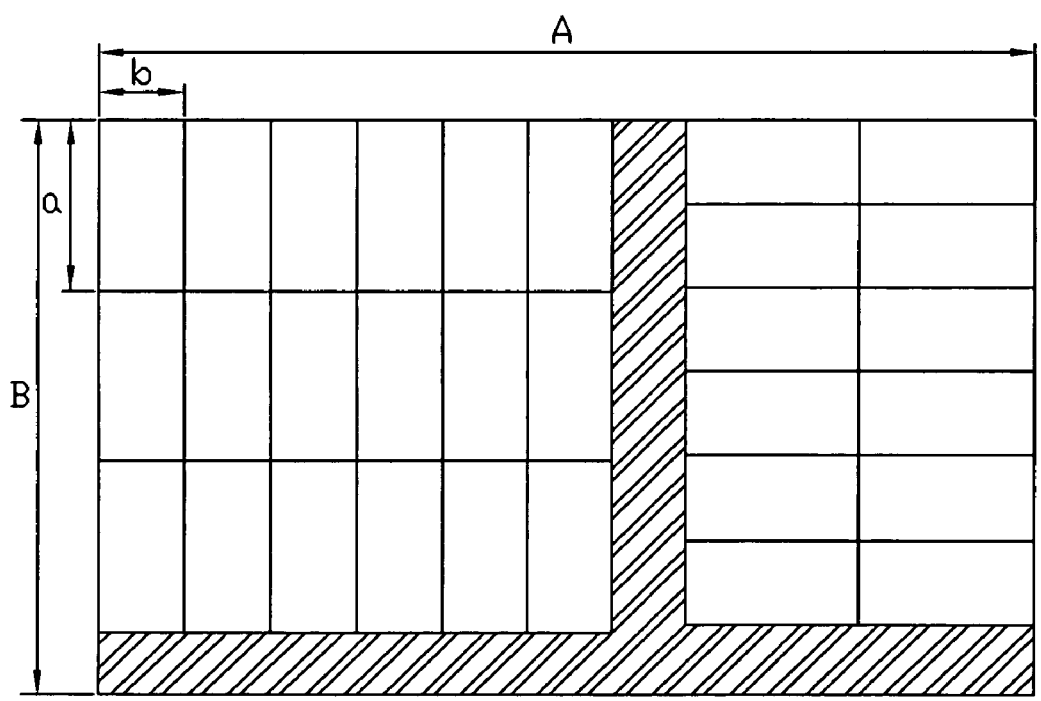
FIG. 3 is a plan view of a second arrangement of the finished PCBs according to a second calculating mode in the method of FIG. 1.

Referring to FIG. 3, a second arrangement of the finished PCBs according to a second calculating mode is shown. In the second calculating mode, the finished PCBs are mainly vertically oriented, and are arranged in rows. The PCB motherboard is defined to include a left part and a right part. The left part of the PCB motherboard is divided into a number j (j=[B/a], wherein j is a natural number) of first rows. Each first row includes a number i ($1 \leq i = [A/b]$, wherein i is a natural number) of vertically oriented finished PCBs. The right part of the PCB motherboard is divided into a number [B/b] of second rows. Each second row includes a number [(A−b×i)/a] of horizontally oriented finished PCBs. An area sum of the finished PCBs divided by the PCB motherboard according to the second calculating mode is calculated with the following formula (2):

$$C_2[i] = i \times \left(\frac{B}{a}\right) + \left(\frac{A - b \times i}{a}\right) \times \left(\frac{B}{b}\right) \quad (2)$$

The computer calculates a plurality of area sums according to the formula (2) while the parameter "i" is respectively equal to 1, 2, 3 . . . [A/b]. Then the computer compares the area sums to obtain a second maximum area sum $C_{2max}[i]$ of the finished PCBs and a corresponding cutting parameter $i_{max\,2}$.

In the left part of the PCB motherboard, the position of a random finished PCB (e.g. in a number i column and in a number j row, counting from left to right and top to bottom can be confirmed by a first position $(X_1, Y_1)$ at a top left corner of the random finished PCB and a second position $(X_2, Y_2)$ at a bottom right corner of the random finished PCB. The first position $(X_1, Y_1)$ and the second position $(X_2, Y_2)$ are calculated according to the following coordinate calculating formulas: $X_1 = b \times (i-1)$, $Y_1 = a \times (j-1)$, $X_2 = b \times i$, $Y_2 = a \times j$.

In the right part of the PCB motherboard, the position of a random finished PCB (e.g. in a number m column and in a number n row, counting from right to left and top to bottom can be confirmed by a third position $(X_3, Y_3)$ at a top left corner of the random finished PCB and a fourth position $(X_4, Y_4)$ at a bottom right corner of the random finished PCB. The third position $(X_3, Y_3)$ and the fourth position $(X_4, Y_4)$ are calculated according to the following coordinate calculating formulas: $X_3 = A - a \times m$, $Y_3 = b \times n - b$, $X_4 = A - a \times m + a$, $Y_{44} = b \times n$.

Figure 4:
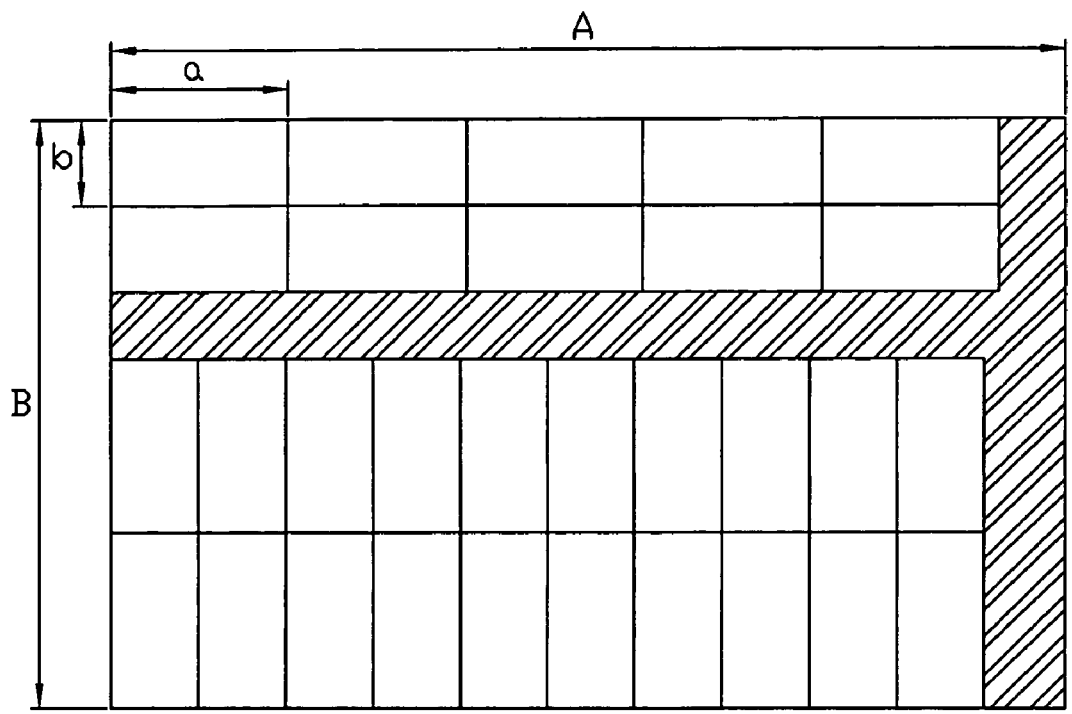
FIG. 4 is a plan view of a third arrangement of the finished PCBs according to a third calculating mode in the method of FIG. 1.

Referring to FIG. 4, a third arrangement of the finished PCBs according to a third calculating mode is shown. In the third calculating mode, the finished PCBs are mainly horizontally oriented, and are arranged in columns. The PCB motherboard is defined to include an upper part and a lower part. The upper part of the PCB motherboard is divided into a number i ($1 \leq i = [B/b]$) of rows. Each row includes a number j (j=[A/a]) of horizontally oriented finished PCBs. The lower part of the PCB motherboard is divided into a number [(B−b×i)/a] of rows. Each row includes a number [A/b] of vertically oriented finished PCBs. An area sum of the finished PCBs divided by the PCB motherboard according to the third calculating mode is calculated with the following formula (3):

$$C_3[i] = i \times \left(\frac{A}{a}\right) + \left(\frac{B - b \times i}{a}\right) \times \left(\frac{A}{a}\right) \quad (3)$$

The computer calculates a plurality of area sums according to the formula (3) while the parameter "i" is respectively equal to 1, 2, 3 . . . [B/b]. Then the computer compares the area sums to obtain a third maximum area sum $C_{3max}[i]$ of the finished PCBs and a corresponding cutting parameter $i_{max\,3}$.

In the upper part of the PCB motherboard, the position of a random finished PCB (e.g. in a number j column and in a number i row, counting from left to right and top to bottom can be confirmed by a first position $(X_1, Y_1)$ at a top left corner of the random finished PCB and a second position $(X_2, Y_2)$ at a bottom right corner of the random finished PCB. The first position $(X_1, Y_1)$ and the second position $(X_2, Y_2)$ are calculated according to the following coordinate calculating formulas: $X_1 = a \times (j-1)$, $Y_1 = b \times (i-1)$, $X_2 = a \times j$, $Y_2 = b \times i$.

In the lower part of the PCB motherboard, the position of a random finished PCB (e.g. in a number n column and in a number m row, counting from left to right and bottom to top can be confirmed by a third position $(X_3, Y_3)$ at a top left corner of the random finished PCB and a fourth position $(X_4, Y_4)$ at a bottom right corner of the random finished PCB. The third position $(X_3, Y_3)$ and the fourth position $(X_4, Y_4)$ are calculated according to the following coordinate calculated formulas: $X_3 = b \times n - b$, $Y_3 = B - a \times m$, $X_4 = b \times n$, $Y_4 = B - a \times m + a$.

Figure 5:
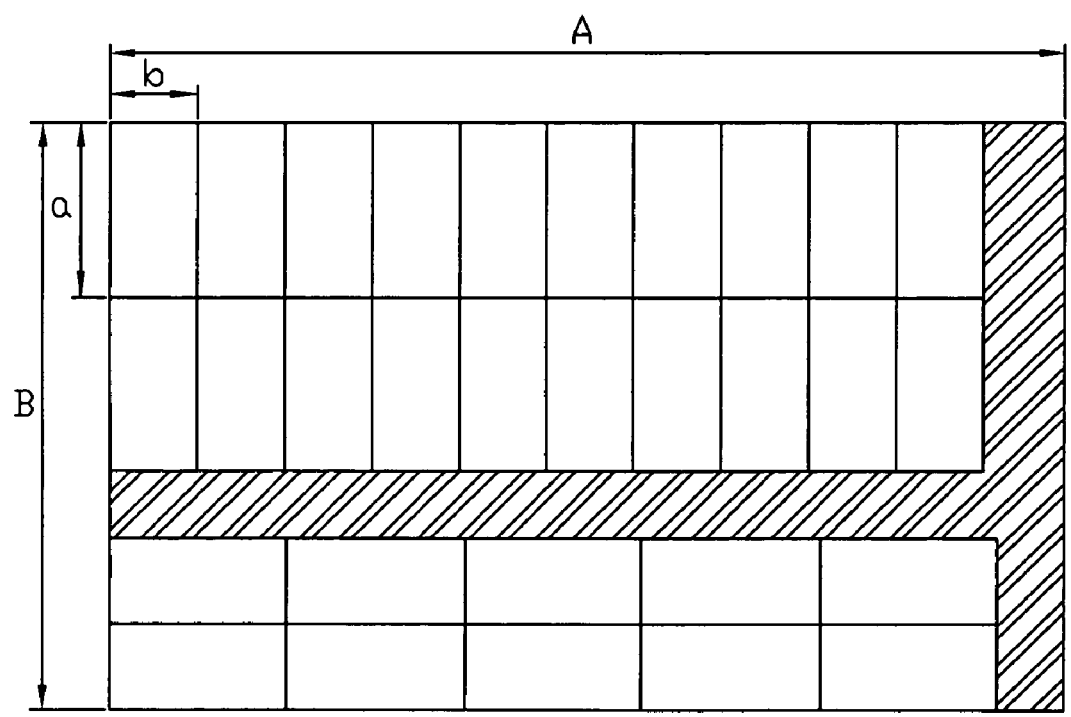
FIG. 5 is a plan view of a fourth arrangement of the finished PCBs according to a fourth calculating mode in the method of FIG. 1.

Referring to FIG. 5, a fourth arrangement of the finished PCBs according to a fourth calculating mode is shown. In the fourth calculating mode, the finished PCBs are mainly vertically oriented, and are arranged in columns. The PCB motherboard is defined to include an upper part and a lower part. The upper part of the PCB motherboard is divided into a number i ($1 \leq i \leq [B/a]$) of rows. Each row includes a number j (j=[A/b]) of vertically oriented finished PCBs. The lower part of the PCB motherboard is divided into a number [(B−a*i)/b] of rows. Each row includes a number [A/a] of horizontally oriented finished PCBs. An area sum of the finished PCBs divided by the PCB motherboard according to the fourth calculating mode is calculated with the following formula (4):

$$C_4[i] = i \times \left(\frac{A}{b}\right) + \left(\frac{B - a \times i}{b}\right) \times \left(\frac{A}{a}\right) \quad (4)$$

The computer calculates a plurality of area sums according to the formula (4) while the parameter "i" is respectively equal to 1, 2, 3 . . . [B/a]. Then the computer compares the area sums to obtain a fourth maximum area sum $C_{4max}[i]$ of the finished PCBs and a corresponding cutting parameter $i_{max\,4}$.

In the upper part of the PCB motherboard, the position of a random finished PCB (e.g. in a number j column and in a number i row, counting from left to right and top to bottom can be confirmed by a first position $(X_1, Y_1)$ at a top left corner of the random finished PCB and a second position $(X_2, Y_2)$ at a bottom right corner of the random finished PCB. The first position $(X_1, Y_1)$ and the second position $(X_2, Y_2)$ are calculated according to the following coordinate calculating formulas: $X_1=b\times(j-1)$, $Y_1=a\times(i-1)$, $X_2=b\times j$, $Y_2=a\times i$.

In the lower part of the PCB motherboard, the position of a random finished PCB (e.g. in a number n column and in a number m row, counting from left to right and bottom to top) can be confirmed by a third position $(X_3, Y_3)$ at a top left corner of the random finished PCB and a fourth position $(X_4, Y_4)$ at a bottom right corner of the random finished PCB. The third position $(X_3, Y_3)$ and the fourth position $(X_4, Y_4)$ are calculated according to the following coordinate calculated formulas: $X_3=a\times(n-1)$, $Y_3=B-b\times m$, $X_4=a\times n$, $Y_4=B-b\times m+b$.

The computer compares the first maximum area sum $C_{1max}[i]$, the second maximum area sum $C_{2max}[i]$, the third maximum area sum $C_{3max}[i]$, and the fourth maximum area sum $C_{4max}[i]$ to obtain an optimum maximum area sum. Thus a best calculating mode and a corresponding cutting parameter are selected according to the optimum maximum area sum.

In step S4, the coordinate parameters for cutting the PCB motherboard are confirmed. After the best calculating mode and the corresponding cutting parameter $i_{max\,1}$, $i_{max\,2}$, $i_{max\,3}$, or $i_{max\,4}$ are confirmed by the computer, the computer calculates the coordinate parameters of each finished PCB according to the corresponding coordinate calculating formulas.

In step S5, the cutting process is demonstrated on a display screen. The coordinate parameters of each finished PCB is transmitted to a display device so as to demonstrate the cutting process on the screen of the display device.

Because the method for cutting a PCB according to the present invention can perform a process to select a best calculating mode and the corresponding cutting parameter, the method for cutting a PCB is relatively simple yet precise.

Those skilled in the art will readily appreciate that numerous modifications and alterations of the above-described method may be made without departing from the scope of the principles of the present invention. Accordingly, the above disclosure should be construed as limited only by the metes and bounds of the appended claims or equivalents thereof.

What is claimed is:

1. A method for cutting a first printed circuit board (PCB) into a plurality of second PCBs, the method comprising:
   providing a plurality of first dimension parameters of the first PCB;
   providing a plurality of second dimension parameters and an interval parameter of the second PCBs;
   performing a process of selecting a best calculating mode and a corresponding cutting parameter according to different arrangements of the second PCBs, the first dimension parameters, the second dimension parameters, and the interval parameter, wherein each arrangement of the second PCBs comprises a first area for part of the second PCBs horizontally oriented and a second area for part of the second PCBs vertically oriented;
   calculating coordinate parameters of each second PCB according to the selected calculating mode and the selected corresponding cutting parameter; and
   cutting the first PCB into the plurality of second PCBs.

2. The method as claimed in claim 1, wherein the first dimension parameters comprise a first length "A" and a first width "B" ($B \leq A$), the second dimension parameters comprise a second length "a" and a second width "b" ($b \leq a$) and the best calculating mode comprises:
   defining the first PCB as having a left part and a right part such that the left part of the first PCB comprises a number j (j=[B/b], wherein j is a natural number) of first columns, each first column comprising a number i ($1 \leq i = [A/a]$, wherein i is a natural number) of horizontally oriented second PCBs, the right part comprising a number [B/a] of second columns, each second column comprising a number [(A−a×i)/b] of vertically oriented second PCBs;
   calculating a plurality of area sums while the parameter "i" is respectively equal to 1, 2, 3 . . . [A/a]; and
   comparing the area sums to obtain a first maximum area sum $C_{1max}[i]$ of the second PCBs and a corresponding cutting parameter i max 1;
   wherein the first maximum area sum $_{C1max}[i]$ of the second PCBs is calculated by the following formula:

$$C_1[i] = i \times \left(\frac{B}{b}\right) + \left(\frac{A - a \times i}{b}\right) \times \left(\frac{B}{a}\right).$$

3. The method as claimed in claim 2, wherein the left part of the first PCB comprises the position of a random selected second PCB in a number i column and in a number j row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=a\times(i-1)$, $Y_1=b\times(j-1)$, $X_2=a\times i$, $Y_2=b\times j$; and the right part of the first PCB comprises the position of a random selected second PCB in a number m column and in a number n row counting from right to left and top to bottom, the position of the random selected second PCB confirmed by a third position $(X_3, Y_3)$ at a top left corner of the random selected second PCB and a fourth position $(x_4, Y_4)$ at a bottom right corner of the random selected second PCB, the third position $(X_3, Y_3)$ and the fourth position $(X_4, Y_4)$ being calculated according to the following coordinate calculating formulas: $X_3=A-b\times m$, $Y_3=a\times n-a$, $X_4=A-b\times m+b$, $Y_4=a\times n$.

4. The method as claimed in claim 1, wherein the first dimension parameters comprise a first length "A" and a first width "B" ($B \leq A$), the second dimension parameters comprise a second length "a" and a second width "b" ($b \leq a$), and the best calculating mode comprises:
   defining the first PCB as having a left part and a right part such that the left part of the first PCB comprises a number j (j=[B/a ], wherein j is a natural number) of first columns, each first column comprising a number i ($1 \leq i = [A/b]$, wherein i is a natural number) of vertically oriented second PCBs, the right part of the first PCB comprising a number [B/b] of second columns, each second column comprising a number [(A−b×i)/a] of horizontally oriented second PCBs;
   calculating a plurality of area sums while the parameter "i" is respectively equal to 1, 2, 3 . . . [A/b]; and
   comparing the area sums to obtain a second maximum area sum $C_{2max}[i]$ of the second PCBs and a corresponding cutting parameter i $_{max\,2}$;
   wherein the second maximum area sum $C_{2max}[i]$ of the second PCBs is calculated by the following formula:

$$C_2[i] = i \times \left(\frac{B}{a}\right) + \left(\frac{A - b \times i}{a}\right) \times \left(\frac{B}{b}\right).$$

5. The method as claimed in claim 4, wherein the left part of the first PCB comprises the position of a random selected second PCB in a number i column and in a number j row counting from left to right and top to bottom, the position of the random selected second PCB confirmed by a first position $(X_1, Y_1)$ at a top left coner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=b\times(i-1)$, $Y_1=a\times(j-1)$, $X_2=b\times i$, $Y_2=a\times j$; and the right part of the first PCB comprises the position of a random selected second PCB in a number m column and in a number n row counting from right to left and top to bottom, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas: $X_3=A-a\times m$, $Y_3=b\times n-b$, $X_4=A-a\times m+a$ $Y_4=b\times n$.

6. The method as claimed in claim 1, wherein the first dimension parameters comprise a first length "A" and a first width "B" ($B \leq A$), the second dimension parameters comprise a second length "a" and a second width "b" ($b \leq a$), and the best calculating mode comprises:

defining the first PCB as having an upper part and a lower part such that the upper part of the first PCB comprises a number i ($1 \leq i \leq [B/b]$) of rows, each row comprising a number j ($j=[B/a]$) of horizontally oriented second PCBs, the lower part of the first PCB comprising a number $[(B-b\times i)/a]$ of rows, each row comprising a number $[A/b]$ of vertically oriented second PCBs calculating a plurality of area sums while the parameter "i" is respectively equal to 1, 2, 3 . . . [B/b]; and comparing the area sums to obtain a third maximum area sum $C_{3max}[i]$ of the second PCBs and a corresponding cutting parameter $i_{max3}$;

wherein the third maximum area sum $C_{3max}[i]$ of the second PCBs is calculated by the following formula:

$$C_3[i] = i \times \left(\frac{A}{a}\right) + \left(\frac{B - b \times i}{a}\right) \times \left(\frac{A}{a}\right).$$

7. The method as claimed in claim 6, wherein the upper, part of the first PCB comprises the position of a random selected second PCB in a number j column and in a number i row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=a\times(j-1)$, $Y_1=b\times(i-1)$, $X_2=a\times j$, $Y_2=b\times i$; and the lower part of the first PCB comprises the position of a random selected second PCB in a number n column and in a number m row counting from bottom to top, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas: $X_3=b\times n-b$, $Y_3=B-a\times m$, $X_{4=b\times n, Y4}=B-a\times m+a$.

8. The method as claimed in claim 1, wherein the first dimension parameters comprise a first length "A" and a first width "B" ($B \leq A$), the second dimension parameters comprise a second length "a" and a second width "b" ($b \leq a$), and the best calculating mode comprises:

defining the first PCB as having an upper part and a lower part such that the upper part of the first PCB comprises a number i ($1 \leq i \leq [B/a]$) of rows, each row comprising a number j ($j=[A/b]$) of vertically oriented second PCBs, the lower part of the first PCB comprising a number $[(B-a*i)/b]$ of rows, each row comprising a number $[A/a]$ of horizontally oriented second PCBs;

calculating a plurality of area sums while the parameter "i" is respectively equal to 1, 2, 3 . . . [B/a], and comparing the area sums to obtain a fourth maximum area sum $C_{4max}[i]$ of the second PCBs and a corresponding cutting parameter $i_{max\ 4}$;

wherein the fourth maximum area sum $C_{4max}[i]$ of the second PCBs is calculated by the following formula:

$$C_4[i] = i \times \left(\frac{A}{b}\right) + \left(\frac{B - a \times i}{b}\right) \times \left(\frac{A}{a}\right).$$

9. The method as claimed in claim 8, wherein the upper part of the first PCB comprises the position of a random selected second PCB in a number j column and in a number i row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=b\times(j-1)$, $Y_1=a\times(i-1)$, $X_2=b\times j$, $Y_2=a\times i$; the lower part of the first PCB comprises the position of a random selected second PCB in a number n column and in a number m row counting from the bottom to top, the position of the random selected second PCB confirmed by a third position $(X_3, Y_3)$ at a top left corner of the random selected second PCB and a fourth position $(X_4, Y_4)$ at a bottom light corner of the random selected second PCB, the third position $(X_3, Y_3)$ and the fourth position $(X_4, Y_4)$ being calculated according to the following coordinate calculating formulas: $X_3=a\times(n-1)$, $Y_3=B-b\times m$, $X_4=a\times n$, $Y_4=B-b\times m+b$.

10. The method as claimed in claim 1, wherein there is a space between the first area and the second area.

11. A method for cutting a first printed circuit board (PCB) into a plurality of second PCBs, the method comprising:

providing a plurality of first dimension parameters of the first PCB;

providing a plurality of second dimension parameters and an interval parameter of the second PCBs;

there being four calculating modes and a plurality of cutting parameters according to different arrangements of the second PCBs in the first PCB and the first dimension parameters, the second dimension parameters, and the interval parameter, wherein each calculating mode comprises a first area for part of the second PCBs horizontally oriented and a second area for part of the second PCBs vertically oriented;

performing a process of selecting a best calculating mode and a corresponding cutting parameter;

calculating coordinate parameters of each second PCB according to the selected calculating mode and the selected corresponding cutting parameter; and cutting the first PCB into the plurality of second PCBs.

12. The method as claimed in claim 11, wherein in the first calculating mode, the first dimension parameters comprise a first length "A" and a first width "B" (B≦A), the second dimension parameters comprise a second length "a" and a second width "b" (b≦a), and the best calculating mode comprises:

defining the first PCB as having a left part and a right part such that the left part of the first PCB comprises a number j (j=[B/b], wherein j is a natural number) of first columns, each first column comprising a number i (1≦i=[A/a], wherein i is a natural number) of horizontally oriented second PCBs, the right part comprising a number [B/a] of second columns, each second column comprising a number [(A−a×i)/b] of vertically oriented second PCBs;

calculating a plurality of area sums while the parameter "i" is respectively equal to 1, 2, 3 . . . [A/a]; and comparing the area sums to obtain a first maximum area sum $C_{1max}[i]$ of the second PCBs and a corresponding cutting parameter $i_{max\ 1}$;

wherein the first maximum area sum $C_{1max}[i]$ of the second. PCBs is calculated by the following formula:

$$C_1[i] = i \times \left(\frac{B}{b}\right) + \left(\frac{A - a \times i}{b}\right) \times \left(\frac{B}{b}\right).$$

13. The method as claimed in claim 12, wherein the left part of the first PCB comprises the position of a random selected second PCB in a number i column and in a number j row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=a\times(i-1)$, $Y_1=b\times(j-1)$, $X_2=a\times i$, $Y_2=b\times j$; and the right part of the first PCB comprises the position of a random selected second PCB in a number m column and in a number n row counting from right to left and top to bottom, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas: $X_3=A-b\times m$, $Y_3=a\times n-a$, $X_4=A-b\times m+b$, $Y_4=a\times n$.

14. The method as claimed in claim 11, wherein in the second calculating mode, the first dimension parameters comprise a first length "A" and a first width "B" (B≦A), the second dimension parameters comprise a second length "a" and a second width "b" (b≦a), and the best calculating mode comprises:

defining the first PCB as having a left part and a right part such that the left part of the first PCB comprises a number j (j=[B/a], wherein j is a natural number) of first columns, each first column comprising a number i (1≦i=[A/b], wherein i is a natural number) of vertically oriented second PCBs, the right part of the first PCB comprising a number [B/b] of second columns, each second column comprising a number [(A−b×i)/a] of horizontally oriented second PCBs;

calculating a plurality of area sums while the parameter "i" is respectively equal to 1, 2, 3 . . . [A/b]; and comparing the area sums to obtain a second maximum area sum $C_{2max}[i]$ of the second PCBs and a corresponding cutting parameter $i_{max\ 2}$;

wherein the second maximum area sum $C_{2max}[i]$ of the second PCBs is calculated by the following formula:

$$C_2[i] = i \times \left(\frac{B}{a}\right) + \left(\frac{A - b \times i}{a}\right) \times \left(\frac{B}{b}\right).$$

15. The method as claimed in claim 14, wherein the left part of the first PCB comprises the position of a random selected second PCB in a number i column and in a number j row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the: following coordinate calculating formulas: $X_1=b\times(i-1)$, $Y_1=a\times(j-1)$, $X_2=b\times i$, $Y_2=a\times j$; and the right part of the first PCB comprises the position of a random selected second PCB in a number m column and in a number n row counting from right to left and top to bottom, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas: $X_3=A-a\times m$, $Y_3=b\times n-b$, $X_4=A-a\times m+a$, $Y_4=b\times n$.

16. The method as claimed in claim 11, wherein in the third calculating mode, the first dimension parameters comprise a first length "A" and a first width "B" (B≦A), the second dimension parameters comprise a second length "a" and a second width "b" (b ≦a), and the best calculating mode comprises:

defining the first PCB as having an upper part and a lower part such that the upper part of the first PCB comprises a number i (1≦i=[B/b]) of rows, each row comprising number j (j=[B/a]) of horizontally oriented second PCBs, the lower part of the first PCB comprising a number [(B−b×i)/a] of rows, each row comprising a number [A/b] of vertically oriented second PCBs.

calculating a plurality of area sums while the parameter "i" is respectively equal to 1, 2, 3 . . . [B/b]; and comparing the area sums to obtain a third maximum area sum $C_{3max}[i]$ of the second PCBs and a corresponding cutting parameter $i_{max\ 3}$;

wherein the third maximum area sum $C_{3max}[i]$ of the second PCBs is calculated by following the formula:

$$C_3[i] = i \times \left(\frac{A}{a}\right) + \left(\frac{B - b \times i}{a}\right) \times \left(\frac{A}{a}\right).$$

17. The method as claimed in claim 16, wherein the upper part of the first PCB comprises the position of a random selected second PCB in a number j column and in a number i row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=a\times(j-1), Y_1=b\times(i-1), X_2=a\times j, Y_2=b\times i$; and the lower part of the first PCB comprises the position of a random selected second PCB in a number n column and in a number m row counting from bottom to top, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas: $X_3=b\times n-b$, $Y_3=B-a\times m, X_4=b\times n, Y_4=B-a\times m+a$.

18. The method as claimed in claim 11, wherein in the fourth calculating mode, the first dimension parameters comprises a first length "A" and a first width "B" ($B \leq A$), the second dimension parameters comprise a second length "a" and a second width "b" ($b \leq a$), and the best calculating mode comprises:

defining the first PCB as having an upper part and a lower part such that the upper part of the first PCB comprises a number i ($1 \leq i \leq [B/a]$) of rows, each row comprising a number j ($j=[A/b]$) of vertically oriented second PCBs, the lower part of the first PCB comprising a number $[(B-a*i)/b]$ of rows, each row comprising a number $[A/a]$ of horizontally oriented second PCBs, calculating a plurality of area sums while the parameter "i" is respectively equal to 1, 2, 3. . . [B/a]; and comparing the area sums to obtain a fourth maximum area sum $C_{4max}[i]$ of the second PCBs and a corresponding cutting parameter $i_{max\,4}$;

wherein the fourth maximum area sum $C_{4max}[i]$ of the second PCBs is calculated by the following formula:

$$C_4[i] = i \times \left(\frac{A}{b}\right) + \left(\frac{B-a \times i}{b}\right) \times \left(\frac{A}{a}\right).$$

19. The method as claimed in claim 18, wherein the upper part of the first PCB comprises the position of a random selected second PCB in a number j column and in a number i row counting from left to right and top to bottom, the position of the random selected second PCB confirmed by a first position $(X_1, Y_1)$ at a top left corner of the random selected second PCB and a second position $(X_2, Y_2)$ at a bottom right corner of the random selected second PCB, the first position $(X_1, Y_1)$ and the second position $(X_2, Y_2)$ being calculated according to the following coordinate calculating formulas: $X_1=b\times(j-1), Y_i=a\times(i-1), X_2=b\times j, Y_2=a\times i$; and the lower part of the first PCB comprises the position of a random selected second PCB in a number n column and in a number m row counting from bottom to top, the position of the random selected second PCB confirmed by a third position $(X_3, Y_3)$ at a top left corner of the random selected second PCB and a fourth position $(X_4, Y_4)$ at a bottom right corner of the random selected second PCB, the third position $(X_3, Y_3)$ and the fourth position $(X_4, Y_4)$ being calculated according to the following coordinate calculating formulas:

$X_3=a\times(n-1), Y_3=B-b\times m, X_4=a\times n, Y_4=B-b\times m+b$.

20. A method for cutting a first printed circuit board (PCB) into a plurality of second PCBs, the method comprising:

providing a plurality of first dimension parameters of the first PCB, wherein the first dimension parameters comprise a first length "A" and a first width "B" ($B \leq A$);

providing a plurality of second dimension parameters and an interval parameter of the second PCBs, wherein the second dimension parameters comprise a second length "a" and a second width "b" ($b \leq a$);

performing a process of selecting a best calculating mode and a corresponding cutting parameter according to the first dimension parameters, the second dimension parameters, and the interval parameter, and calculating coordinate parameters of each second PCB, wherein selecting the best calculating mode and the corresponding cutting parameter comprises:

defining the first PCB as having a left part and a right part such that the left part of the first PCB comprises a number j ($j=[B/b]$, wherein j is a natural number) of first columns, each first column comprising a number i ($1 \leq i=[A/a]$, wherein i is a natural number) of horizontally oriented second PCBs, the right part comprising a number [B/a] of second columns, each second column comprising a number $[(A-a\times i)/b]$ of vertically oriented second PCBs;

calculating a plurality of area sums while the parameter "i" is respectively equal to 1, 2, 3 . . . [A/a]; and comparing the area sums to obtain a first maximum area sum $C_{1max}[i]$ of the second PCBs and a corresponding cutting parameter i max 1; and cutting the first PCB into the plurality of second PCBs.

* * * * *

UNITED STATES PATENT AND TRADEMARK OFFICE
CERTIFICATE OF CORRECTION

PATENT NO. : 7,891,280 B2  
APPLICATION NO. : 12/080308  
DATED : February 22, 2011  
INVENTOR(S) : Xiang-Qing Kong, Jian-Feng Wang and Tong Zhou Page 1 of 1

It is certified that error appears in the above-identified patent and that said Letters Patent is hereby corrected as shown below:

Title Page;
Please replace Section (73) regarding "Assignees" on the front page of the Patent with the following:

(73) Assignees: Innocom Technology (Shenzhen) Co., Ltd., Shenzhen, Guangdong Province (CN); Chimei Innolux Corporation, Miao-Li County (TW).

Signed and Sealed this
Seventh Day of June, 2011

David J. Kappos
*Director of the United States Patent and Trademark Office*